United States Patent
Cheng et al.

(10) Patent No.: US 7,031,354 B2
(45) Date of Patent: Apr. 18, 2006

(54) STABLE HIGH EFFICIENCY MULTIPLE WAVELENGTH LASER SOURCES

(75) Inventors: Hsing Cheng, San Jose, CA (US);
Hongmin Chen, Acton, MA (US);
Hamid R. Khazaei, Westford, MA (US)

(73) Assignee: Optovia Corporation, Action, MA (US)

( * ) Notice: Subject to any disclaimer, the term of this patent is extended or adjusted under 35 U.S.C. 154(b) by 92 days.

(21) Appl. No.: 10/776,809

(22) Filed: Feb. 11, 2004

(65) Prior Publication Data

US 2005/0175047 A1  Aug. 11, 2005

(51) Int. Cl.
*H01S 3/13* (2006.01)
(52) U.S. Cl. .................... 372/29.02; 372/99
(58) Field of Classification Search .............. 372/9, 372/29.02; 385/24
See application file for complete search history.

(56) References Cited

U.S. PATENT DOCUMENTS

| | | | |
|---|---|---|---|
| 6,052,394 A * | 4/2000 | Lee et al. | 372/6 |
| 6,351,583 B1 * | 2/2002 | Bergmann et al. | 385/14 |
| 6,400,860 B1 * | 6/2002 | Chandrasekhar et al. | 385/24 |
| 6,459,829 B1 * | 10/2002 | Yamauchi et al. | 385/24 |
| 6,525,872 B1 * | 2/2003 | Ziari et al. | 359/341.3 |

OTHER PUBLICATIONS

Book entitled "Fundamentals of Optical Waveguides"by K. Okamaota, Published by Academic Press, 2000, pp. 161-165.*

Paper entitled "Fiber Loop Reflectors" by D. B. Mortimore, Journal of Lightwave Technology, vol. 6, No. 7, Jul. 1988, at pp. 1212-1223.*

Paper entitled "Optical Fiber Filter Comprising a Single-Coupler Fiber Ring (or Loop) and a Double-Coupler Fiber Mirror" by Y. H. Ja, Journal of Lightwave Technology, vol. 9, No. 8, Aug. 1991, pp. 964-974 and.*

Paper entitled "Wavelength and intensity stabilization of 980nm diode lasers coupled to fibre Bragg gratings" by R. F. Ventrudo et al., Electronic Letters, Dec. 8, 1994, vol. 30, No. 25, at pp. 2147-2149.*

Book entitled "Diode Lasers and Photonic Integrated Circuits" by L. A. Coldren and S. W. Corzine, Published by Wiley & Sons, 1995, pp. 252-257.*

* cited by examiner

*Primary Examiner*—Minsun Harvey
*Assistant Examiner*—Dung Nguyen
(74) *Attorney, Agent, or Firm*—Irwin Ostroff; Erwin W. Pfeifle

(57) ABSTRACT

In a stabilized laser system, an output of a desired wavelength is generated. Each of a plurality of n lasers, which, while emitting light and having a preselected portion thereof fed back thereto, causes the fed back portion to be amplified and shifted in wavelength in a first direction which is spaced apart from the center wavelength of the feedback signal. A feedback stabilization arrangement is coupled to output ports of the plurality of n lasers for generating a feedback signal having a wavelength spectrum peaking at a wavelength shifted in an opposite direction to the first direction generated by the lasers in response to the feedback signal so as to provide an output signal at the output of the stabilized laser system having a wavelength spectrum that peaks essentially at the desired wavelength. A reflector is located at a predetermined signal round-trip time delay distance from the feedback stabilization arrangement. The reflector receives the output signal from the feedback stabilization arrangement and passes a first portion thereof therethrough, and reflects a remaining second portion back to the feedback stabilization arrangement as a secondary feedback signal that contributes to each of the plurality of n laser sources being set in a stable coherence collapse mode.

16 Claims, 3 Drawing Sheets

STABLE HIGH EFFICIENCY MULTIPLE WAVELENGTH LASER SOURCES

CROSS-REFERENCE TO RELATED APPLICATIONS

This application is related to U.S. Ser. No. 10/776,808, which is entitled "High Efficiency Single And Multiple Wavelength Stabilized Laser Systems" (Optovia 6), and U.S. Ser. No. 10/776,810, which is entitled "Single And Multiple Wavelength Reflection And Transmission Filter Arrangements" (Optovia 7), having a common assignee and some common inventors with the present invention, and being filed concurrently with the present invention.

FIELD OF THE INVENTION

The present invention relates to method and apparatus for providing a stable multimode spectrum for a stabilized laser system based on the use of a transmission filter while reducing excess loss and thereby increasing the laser system's efficiency.

BACKGROUND OF THE INVENTION

Pump lasers are generally found in the form of Fabry-Perot (FP) cavity lasers whose multimode spectrums are broadband and extremely sensitive to temperature and laser drive current and, therefore, requires stabilization in most applications such as optical amplifiers. Different methods have been proposed in the past to stabilize a single laser or a system of multiple lasers.

In a first method, a pump laser is coupled at its output to a reflection filter, such as Fiber Bragg Gratings (FBG), which selectively reflects part of the laser spectrum back towards the laser and, therefore, stabilizes the laser spectrum and power. This first method has been extensively used to stabilize a single laser. Some multi-wavelength applications have also used the first method to stabilize multiple lasers using individual FBGs followed by a wavelength division multiplexer (WDM) to combine the stabilized laser signals.

Referring now to FIG. 1, there is shown a schematic of a prior art arrangement 10 for stabilizing a single laser source 11 using a combination of a transmission filter 12 having a wavelength spectral response of F(w) and a reflector 13 that are shown within a dashed line rectangle illustrating the second method indicated hereinabove. In the arrangement 10, an output/input facet 11a of the laser source 11 is coupled to a first input/output port 12a of the transmission filter 12 via a path A. A second output/input port 12b of the transmission filter 12 is coupled to a first input/output port 13a of the reflector 13 via a path B. A second port 13b of the reflector 13 provides an output signal from the stabilized laser system arrangement 10 via a path C.

The transmission filter 12 sets the wavelength based on its spectral response F(w), and the reflector 13 sets the amount of signal reflection provided back through the transmission filter 12 to the laser source 11. When a portion of the signal filtered by the transmission filter 12 is reflected by the reflector 13, it is again filtered by the transmission filter 12 with the spectral response F(w) to provide a feedback signal to the output facet 11a of the laser source 11. In response to the feedback signal, it is found that the laser source 11 produces a wavelength shift $\delta w$ in a first direction, and generates an output signal that now peaks at a center wavelength that is shifted by an amount $\delta w$ from the peak wavelength of transmission filter F(w) and is no longer at the desired wavelength as is shown in FIG. 2, resulting in excess loss and system inefficiency.

Referring now to FIG. 2, there is shown a graph of wavelength (w) on the X-axis versus Intensity (dB) on the Y-axis for exemplary curves 16 and 17 representing the forward filter spectral response and the feedback filter spectral response, respectively, and an exemplary output signal center wavelength represented by the line 18. In operation, the output signal (not shown in FIG. 2) generated by the laser source 11 is filtered once by the transmission filter 12 with a spectral response curve F(w) as is shown by curve 16 to provide an output signal from the system 10 where the power peaks at a center wavelength represented by the line 18. For the system 10 of FIG. 1, the forward filter spectral response for the transmission filter 12 is defined as $F_o(w)=F(w)$ as the transmission filter spectral response between the output/input facet 11a of the laser source 11 and the output port 13b from the reflector 13.

When a portion of this filtered signal is reflected by reflector 13, it is again filtered for the second time by the transmission filter 12 resulting in a narrower signal and returned to the output/input facet 11a of the laser source 11. The feedback filter spectral response for the system 10 is defined as the spectral response between the forward and backward (feedback) signals found at the output/input facet 11a of the laser source 11, $F_f(w)=F(w)_f F(w)$. As a result of the fed back signal, it is found that the laser source 11 produces a wavelength shift and now generates an output signal that now peaks at the center frequency shown by line 18 which is separated by an amount $\delta w$ from the peak of curve 16 as is shown in FIG. 2. This results in an excess loss of power in the output signal of the system 10. The above description indicates that the laser source 11 produces a red shift (e.g., a first direction) in response to a feedback signal. The occurrence of a red shift (in the first direction) shown in FIG. 2 is mostly true for semiconductor diodes lasers. However, there are other types of lasers that actually produce a blue shift (in a second opposite direction from a red shift) in response to the reception of a feedback signal that also causes a similar excess loss.

The main requirements for pump sources in optical amplification are power efficiency, relative intensity noise (RIN), stimulated Brillouin Scattering (SBS), and spectral stability. It is desirable to provide a stabilized multi-wavelength source that provides for the requirements of power efficiency, stimulated Brillouin Scattering (SBS), and spectral stability.

SUMMARY OF THE INVENTION

The present invention relates to method and apparatus for providing a stable multimode spectrum for a stabilized laser system based on the use of a transmission filter while reducing excess loss and thereby increasing the laser system's efficiency.

From a first apparatus aspect, the present invention relates to a stabilized laser system comprising a plurality of n lasers, a feedback generating arrangement, and a reflector. Each of the plurality of n lasers, which, while emitting light and having a preselected portion thereof fed back thereto, causes the fed back portion to be amplified and shifted in wavelength in a first direction which is spaced apart from the center wavelength of the feedback signal. The feedback stabilization arrangement is coupled to output ports of the plurality of n lasers for generating a feedback signal having a wavelength spectrum peaking at a wavelength shifted in an opposite direction to the first direction generated by the plurality of n lasers in response to the feedback signal so as to provide an output signal at the output of the stabilized laser system having a wavelength spectrum that peaks essentially at a desired wavelength. The reflector is located at a predetermined signal round-trip time delay distance from the feedback stabilization arrangement for receiving the filtered and multiplexed output signal therefrom, for passing a first portion thereof therethrough, and for reflecting a remaining second portion thereof back to the feedback stabilization arrangement as a secondary feedback signal that contributes to each of the plurality of n laser sources being set in a stable coherence collapse mode.

From a second apparatus aspect, the present invention is directed to apparatus comprising a feedback stabilization arrangement, and a reflector. The feedback stabilization arrangement comprises a multiplexer/demultiplexer comprising a plurality of n first input/output ports and a second input/output port. Each first input/output port is adapted to receive an output signal from a corresponding one of a plurality of n laser sources for filtering and multiplexing the received laser source signals using a first spectral response for generating a filtered and multiplexed output signal for transmission from the feedback stabilization arrangement at the second input/output port thereof. The feedback stabilization arrangement further generates a filtered and demultiplexed feedback signal by the multiplexer/demultiplexer that is wavelength shifted by a predetermined amount and direction for transmission back to an output port of each of the corresponding ones of the plurality of n laser sources for stabilizing each of said plurality of laser sources at a desired output center wavelength. The reflector is located at a predetermined signal round-trip time delay distance from the feedback stabilization arrangement for receiving the filtered and multiplexed output signal from the feedback stabilization arrangement, for passing a first portion thereof therethrough, and for reflecting a remaining second portion back to the feedback stabilization arrangement as a secondary feedback signal that contributes to each of the plurality of n laser sources being set in a stable coherence collapse mode.

From a third apparatus aspect, the present invention is directed to a feedback stabilization system comprising a plurality of n laser sources, a feedback stabilization arrangement, and a reflector. Each laser source, which, while emitting light and having a preselected portion thereof fed back thereto, causes the fed back portion to be amplified and shifted in wavelength in a first direction that is spaced apart from a center wavelength of the feedback signal. The feedback stabilization arrangement comprises a multiplexer/demultiplexer comprising a plurality of n first input/output ports. Each first input/output port is coupled for receiving an output signal from a corresponding one of the plurality of n laser sources for filtering the received signals using a first spectral response and multiplexing the received signals for generating a filtered and multiplexed output signal at a second input/output port thereof for use as an output signal from the feedback stabilization arrangement. The feedback stabilization arrangement further generates a filtered and demultiplexed feedback signal by the multiplexer/demultiplexer that is wavelength shifted by a predetermined amount and direction for transmission back to an output port of each of the corresponding ones of the plurality of n laser sources for stabilizing each of said plurality of laser sources at a desired output center wavelength. The reflector is located at a predetermined signal round-trip time delay distance from the feedback stabilization arrangement for receiving the multiplexed output signal from the feedback stabilization arrangement, for passing a first portion thereof therethrough, and for reflecting a remaining second portion back to the feedback stabilization arrangement as a secondary feedback signal that contributes to each of the plurality of n laser sources being set in a stable coherence collapse mode.

From a method aspect, the present invention is directed to a method of stabilizing a laser system to generate an output signal having a desired wavelength. In the method, output light signals are generated from each of a plurality of n laser sources, which, while emitting light and having a preselected portion thereof fed back thereto, the output signal of each of the plurality of n laser sources is shifted in wavelength in a first direction which is spaced apart from a center wavelength of the feedback signal. A feedback signal is generated in a feedback stabilization arrangement coupled to the plurality of n lasers having a wavelength spectrum peaking at a wavelength shifted in an opposite direction to the first direction generated by the plurality of n lasers in response to the feedback signal so as to provide an output signal at the output of the stabilized laser system having a wavelength spectrum that peaks essentially at the desired wavelength. A portion of the output signal from the stabilized laser system is reflected back into the laser system as a secondary feedback signal that is delay by a predetermined amount for contributing to each of the plurality of n laser sources being set in a stable coherence collapse mode.

The invention will be better understood from the following more detailed description taken with the accompanying drawings and claims.

The drawings are not necessarily to scale.

DETAILED DESCRIPTION OF THE INVENTION

The present invention is directed to providing a stabilized multi-wavelength source that provides for requirements of power efficiency, stimulated Brillouin Scattering (SBS), and spectral stability. Power efficiency is defined as a ratio of output optical power to input electrical power to drive a laser. Still further, to provide an efficient laser, insertion loss between the laser and the output optical fiber has to be minimized to increase system efficiency.

Stimulated Brillouin Scattering (SBS) is a nonlinear optical effect that causes light to scatter in a reverse direction such that the light does not contribute to the amplification process and causes a system penalty. There is a threshold level of signal power at which this phenomenon occurs that depends on each of the optical waveguide and the signal properties. There are two methods for SBS suppression which involve laser linewidth broadening and multimode operation.

Spectral stability is described as a stable single mode or a multimode spectral density over time and current with no mode hopping. Stabilized external cavity lasers can be designed such that the output signal is multimode with a linewidth so large that a coherence length of the laser signal drops significantly. This operating condition is well known as "coherence collapse" that results in a stable (no mode hopping) multimode signal spectrum. In order to achieve coherence collapse operation, it is necessary to consider the total effective reflectivity, the parameters of different components of a feedback signal, and the external cavity length.

Figure 1:
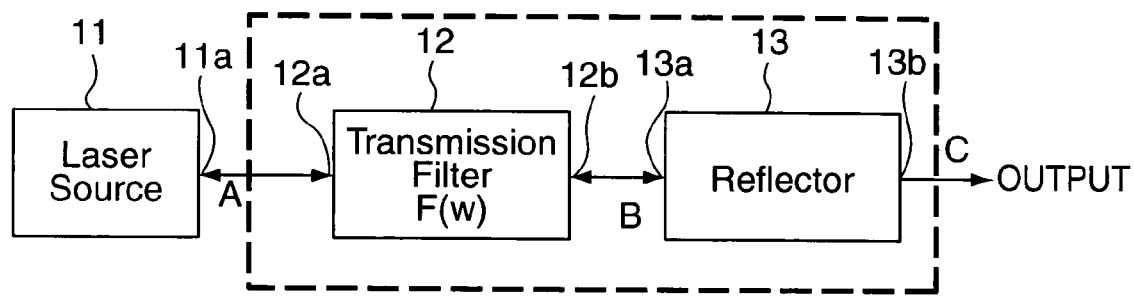
FIG. 1 shows a schematic diagram of a prior art stabilized laser system.
Figure 3:
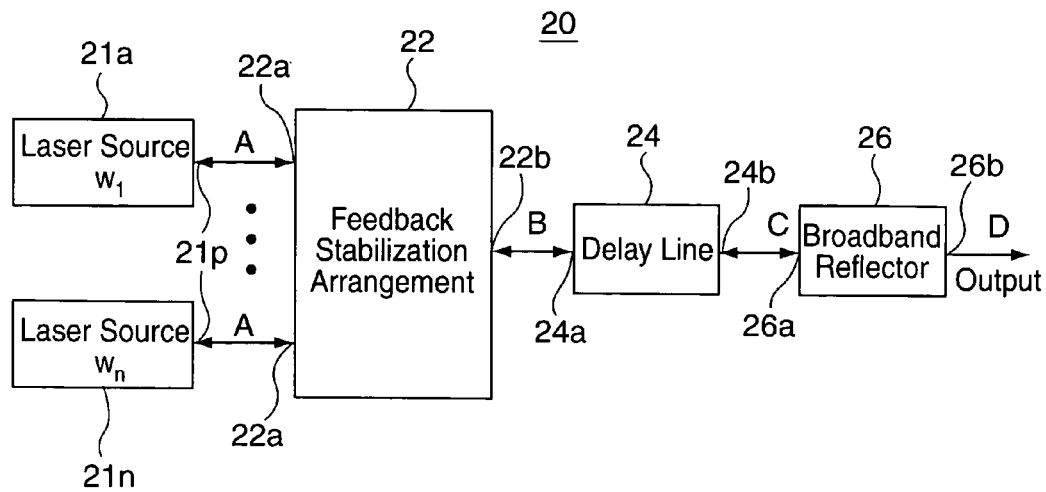
FIG. 3 shows a schematic of a basic concept of a stabilized multiple laser system in accordance with the present invention.

Referring now to FIG. 3, there is shown a schematic of a stabilized multiple laser system 20 illustrating a basic concept of the present invention. The stabilized multiple laser system 20 comprises a plurality of n lasers sources 21a–21n that generate a plurality of n output signals $w_1$–$w_n$, respectively, a feedback stabilization arrangement 22, a delay line 24, and a broadband reflector 26. The feedback stabilization arrangement 22 can comprise many different arrangements which provide a feedback signal back to each of the plurality of n laser sources 21a–21n that overcomes a red or blue (hereinafter a first direction) shift of each laser 21a–21n in response to a feedback signal as was described hereinbefore for the prior art system 10 of FIG. 1. For example, various multi-wavelength feedback stabilization arrangements that can be used for the multi-wavelength stabilization arrangement 22 are shown and described in the hereinbefore indicated copending application U.S. Ser. No. 10/776,808, entitled "High Efficiency Single And Multiple Wavelength Stabilized Laser Systems" (Optovia 6), and is incorporated by reference herein rather than describing each of those arrangement herein again.

Each of the plurality of n laser sources 21a–21n is coupled at an input/output front facet 21p thereof to a separate one of a plurality of n first input/output ports 22a of the feedback stabilization arrangement 22 via a separate path A. A second input/output port 22b of the feedback stabilization arrangement 22 is coupled to a first input/output port 24a of the delay line 24 via a path B. A second input/output port 24b of the delay line 24 is coupled to a first port 26a of the broadband reflector 26 via a path C. A second port 26b of the broadband reflector 26 provides a stabilized output signal from the stabilized multiple laser system 20 via a path D.

In operation, the output signal from each of the plurality of n laser sources 21a–21n is received at a corresponding one of the plurality of n input/output ports 22a of the feedback stabilization arrangement 22 via a path A. In the feedback stabilization arrangement 22, the plurality of n received signals via paths A are each filtered with a predetermined first spectral response and multiplexed to generate an output signal at the second input/output ports 22b thereof for transmission via the path C to the first input/output port 24a of the delay line 24. Concurrently, the feedback stabilization arrangement 22 also generates a feedback signal that is filtered and demultiplexed, and a corresponding one of the demultiplexed signals is returned to each of the laser sources 21a–21n that is shifted in a second direction to counteract a red or blue (first direction) shift in response to a feedback signal to a laser. Such red or blue shift counteracting feedback signal is generated in the feedback stabilization arrangement 22 in a manner shown and described for the various multi-wavelength feedback stabilization arrangements in the hereinbefore indicated copending application U.S. Ser. No. 10/776,808, entitled "High Efficiency Single And Multiple Wavelength Stabilized Laser Systems" (Optovia 6).

The output signal from the feedback stabilization arrangement 22 via path B is delayed by a predetermined amount of time in the delay line 24 and then partially reflected by the broadband reflector 26 and returned via the delay line 24 and the feedback transmission arrangement 22 to each of the lasers 21a–21n. The remainder of the signal that is not reflected in the broadband reflector 24 is transmitted as the output signal of the system 20 via path D. The desired optical path length of the second feedback signal caused by the broadband reflector 26 is represented by the delay line 24. The main function of placing the delay line 24 and the broadband reflector 26 at predetermined round-trip delay time distance from the output of the feedback stabilization arrangement 22 is to provide a small secondary feedback signal that, upon reaching the lasers 21a–21n, causes each of the plurality of n laser sources 21a–21n to enter the coherence collapse mode. Therefore, the system 20 has to be designed and built such that a minimum required reflection in a desired polarization reaches the front facet 21p of each of the laser sources 21a–21n. However, for a stable operation of the stabilized multi-wavelength laser system 20, the entire optical path wherein the feedback signal of the feedback stabilization arrangement 22 is traveling must preserve the polarization state (polarization maintaining, PM) so that the feedback signal therefrom is not subjected to a fluctuation in polarization state due to signal and environmental conditions.

The secondary feedback signal from the broadband reflector 26 can comprises multiple components obtained from the signal round trip through a cavity constructed between the reflector 26 and a loop or another reflector inside the feedback stabilization arrangement 22 (as will be better understood from the description of FIG. 5 hereinafter). These components enter the front facet 21p of each of the plurality of n laser sources 21a–21n. The feedback stabilization arrangement 22 by itself generates a feedback signal that primarily compensates for a shift in a first direction (e.g., red shift) normally occurring in each laser in response to a reflected feedback signal and thereby avoids excess loss. The delay line 24 and broadband reflector 26 are positioned at predetermined locations after the output port 22b of the feedback stabilization arrangement 22 to provide a secondary feedback signal through the feedback stabilization arrangement 22 that provides the conditions for each of the laser sources 21a–21n to enter into the "coherence collapse" operating mode, and promotes a stable multimode output signal spectrum.

Figure 2:
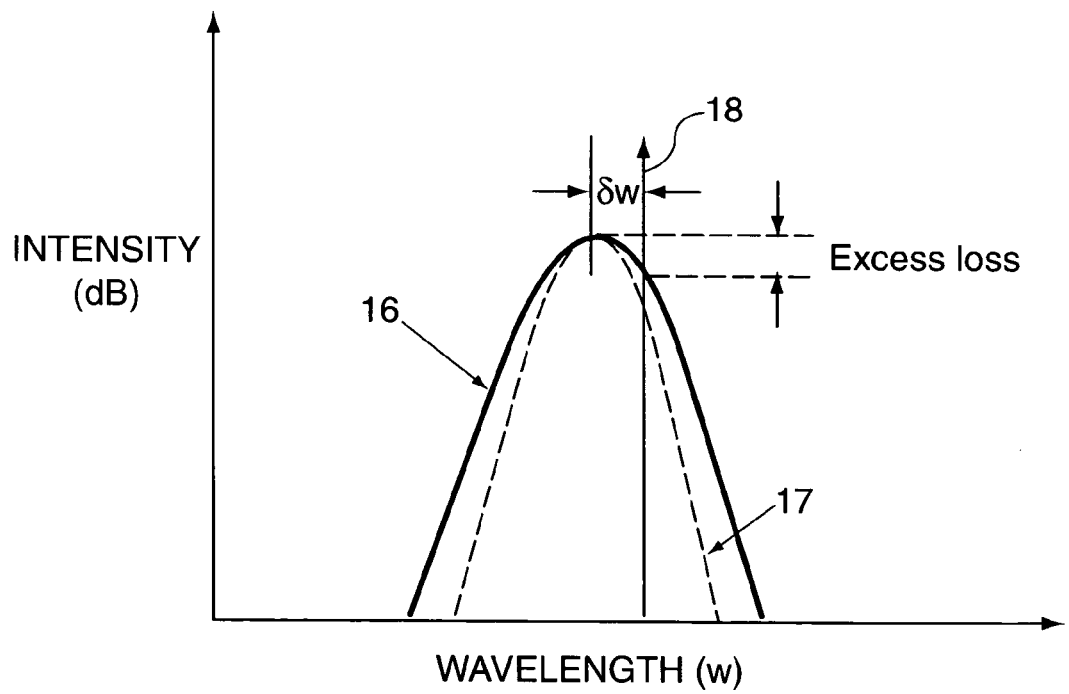
FIG. 2 shows a graph of forward and feedback filter spectral responses in the prior art laser system of FIG. 1.
Figure 4:
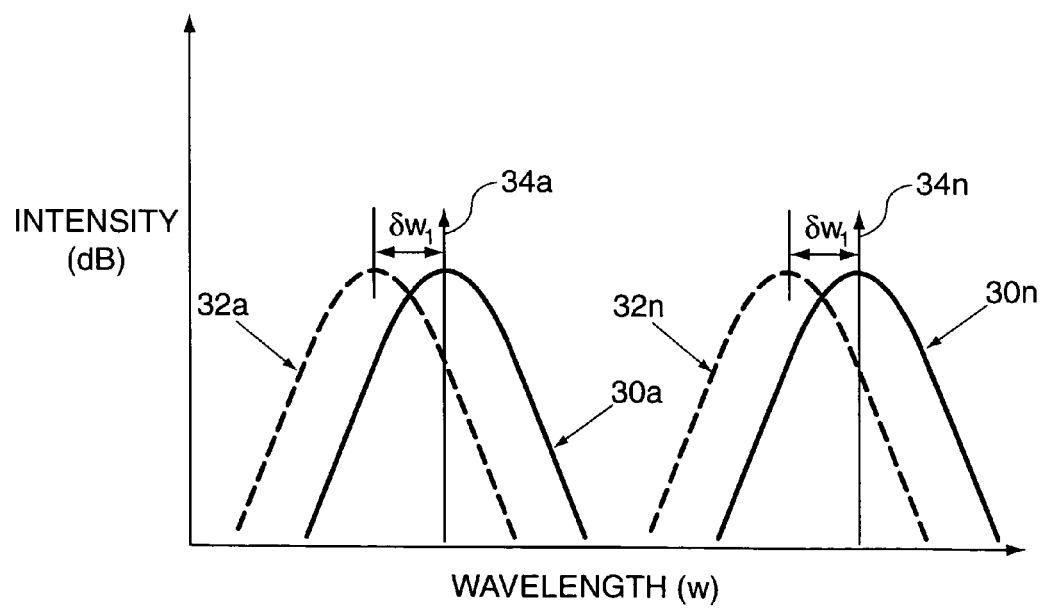
FIG. 4 shows a graph of forward and feedback filter spectral responses as might be found in the multiple laser system of FIG. 3.

Referring now to FIG. 4, there is shown a graph of wavelength (w) on the X-axis versus intensity (dB) on the Y-axis for illustrating exemplary forward filter spectral response curves 30a–30n (only curves 30a and 30n are shown), and dashed line feedback filter spectral response curves 32a–32n (only curves 32a and 32n are shown) as might be found in the multi-wavelength blue shifted feedback stabilization arrangement 22 of FIG. 3. The feedback stabilization arrangement 22 is designed such that, for a laser source 21j channel, the center wavelength of a feedback filter spectral response for a jth wavelength, $F_f^j(w)$, (not shown) is shifted toward a shorter wavelength (blue shift) by an amount $\delta w^j$ to compensate for a red shift of the laser center wavelength of laser source 21j (not shown). The blue shift design of the feedback stabilizing arrangement 22 moves the center wavelength 34j of the stabilized laser source 21j close to the center wavelength of the forward filter spectral response, $F_o^j(w)$, 30j as a result of the received blue shifted feedback signal. The same operation occurs for each of the other laser sources 21a–21n as is shown for the laser sources 21a and 21n by the curves 30a and 32a, and 30n and 32n, respectively, and the respective center wavelength lines 34a and 34n. The blue shift for the feedback signal for each of the laser sources 21a–21n minimizes the excess loss shown in FIG. 2 for the laser source 11 associated with the conventional stabilized laser system 10 of FIG. 1 using a transmission filter 12.

Figure 5:
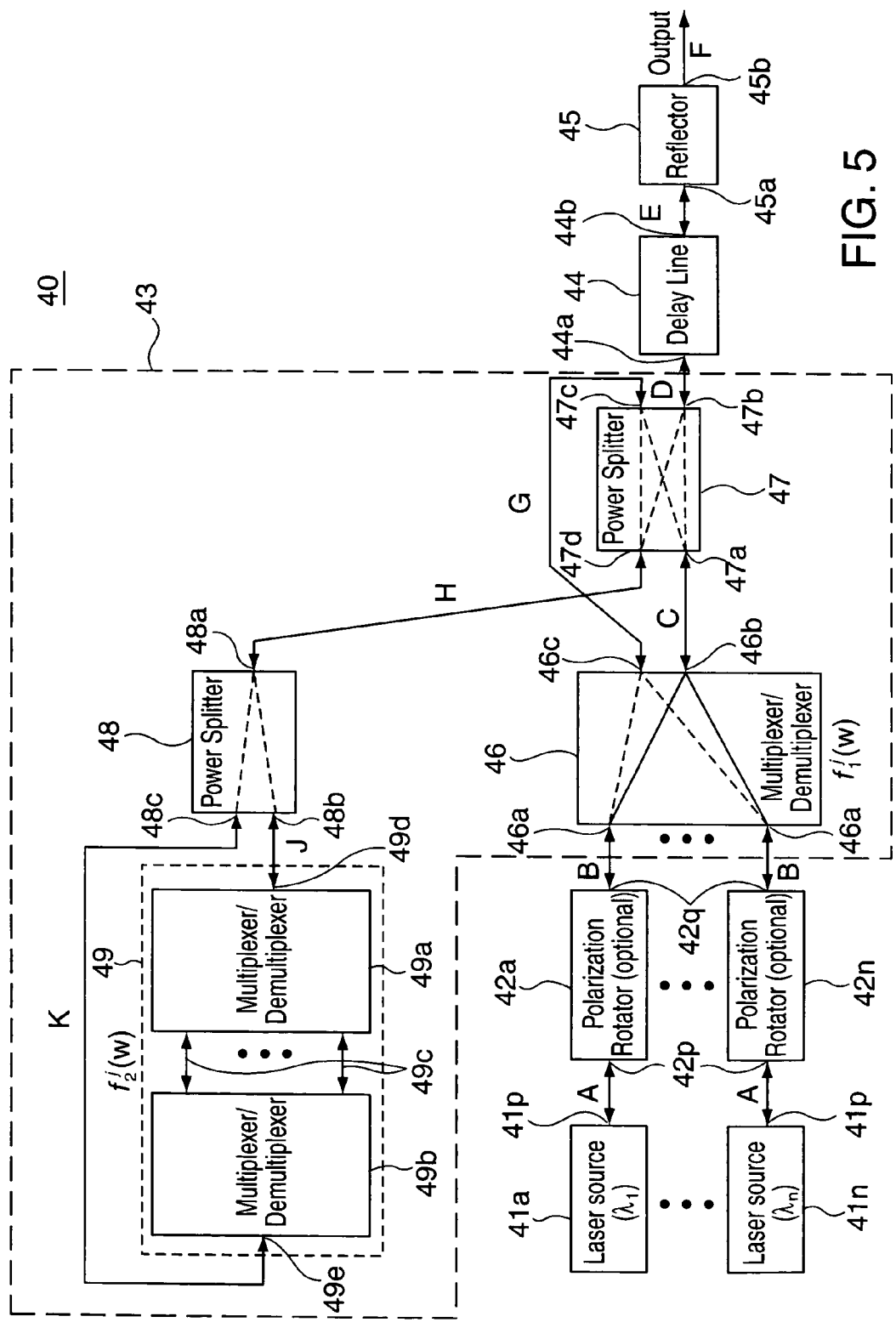
FIG. 5 shows a schematic of an exemplary stabilized multiple laser system in accordance with a preferred embodiment of the present invention.

Referring now to FIG. 5, there is shown a schematic of an exemplary stabilized multiple laser system 40 in accordance with a preferred embodiment of the present invention. The exemplary stabilized multiple laser system 40 comprises a plurality of n laser sources 41a–41n, a plurality of n optional polarization rotators 42a–42n, a feedback stabilization arrangement 43 (shown within a dashed line area), a delay line 44, and a reflector 45. The feedback stabilization arrangement 43 comprises a first multiplexer/demultiplexer 46, a first power splitter 47, a second power splitter 48, and a second multiplexer/demultiplexer arrangement 49, (shown within a dashed line rectangle). The second multiplexer/demultiplexer arrangement 49 comprises a first multiplexer/demultiplexer 49a, and a second multiplexer/demultiplexer 49b in a back-to-back relationship interconnected by a plurality of paths 49c. Hereinafter, the term multiplexer/demultiplexer will be referred to as "Mux/Demux".

A front facet 41p of each of the plurality of n laser sources 41a–41n is coupled to a first input/output port 42p of a corresponding one of the plurality of n optional polarization rotators 42a–42n when present by a separate path A. A second input/output port 42q of each of the plurality of n optional polarization rotators 42a–42n is coupled to a corresponding one of a plurality of n first input/output ports 46a of the first Mux/Demux 46 via a separate path B. A second input/output port 46b of the Mux/Demux 46 is coupled to a first input/output port 47a of the first power splitter 47 via a path C, and a third input/output port 46b of the Mux/Demux 46 is coupled to a third input/output port 47c of the first power splitter 47 via a path G.

A second input/output port 47b of the first power splitter 47 provides an output signal from the feedback stabilization arrangement 43 via a path D to a first input/output port 44a of the delay line 44. A second input/output port 44b of the delay line 44 is coupled to a first port 45a of the reflector 45 via a path E. A second port 45b of the reflector 45 provides the output signal from the overall exemplary stabilized multiple laser system 40 via a path F.

A fourth input/output port 47d of the first power splitter 47 is coupled to a first input/output port 48a of the second power splitter 48 via a path H. A second input/output port 48b of the second power splitter 48 is coupled to a first input/output port 49d of the Mux/Demux arrangement 49 via a path J. A third input/output port 48c of the second power splitter 48 is coupled to a second input/output port 49e of the Mux/Demux arrangement 49 via a path K.

In operation, each of the plurality of n laser sources 41a–41n generates an output signal that is transmitted via a path A to the first input/output port 42p of a corresponding one of the plurality of n optional polarization rotators 42a–42n when present. The optional polarization rotators 42a–42n are included between the laser sources 41a–41n, respectively, and the respective first input/output ports 46a of the first Mux/Demux 46 in case the laser output state of polarization (TE to TM, or vice versa) is to be rotated. The polarized output signals from the optional polarization rotators 42a–42n are transmitted to corresponding ones of the first input/output ports 46a of the first Mux/Demux 46 via separate paths B.

In the feedback stabilization arrangement 43, the plurality of n output signals received at the first input/output ports 46a of the first Mux/Demux 46 and a first portion of the received signals is filtered and multiplexed using a spectral response $f_1{}^j(w)$, and the resultant filtered and multiplexed signal is directed to the second input/output port 46b thereof. A second portion of the received signals is multiplexed and filtered using a spectral response $f_3{}^j(w)$ and directed to the third input/output port 46c thereof. The multiplexed signal from the second input/output port 46b of the first Mux/Demux 46 is transmitted via path C and received at the first input/output port 47a of the first power splitter 47. The second portion of the filtered and multiplexed signal is transmitted via path G to the third input/output port 47c of the second power splitter 47.

In the first power splitter 47 the multiplexed signal received at the first input/output port 47a, and any signal received at the fourth input/output port 47d, is split into first and second portions thereof. The first portion of the signals from the first input/output port 47a and the fourth input/output port 47d is directed to the second input/output port 47b of the first power splitter 47 and becomes the output signal from the feedback stabilization arrangement 43 via path D. The second portion of the signals from the first input/output port 47a and the fourth input/output port 47d is directed as a feedback signal to the third input/output port 46c of the first Mux/Demux 46. The output signal from the second input/output port 47b of the first power splitter 47 is transmitted through the delay line 44 to the reflector 45 via paths D and E. In the reflector 45, the signal is partially reflected back through the delay line 44 to the second input/output port 47b from the first power splitter 47, and the remaining signal is provided as the output signal from the exemplary stabilized multiple laser system 40.

The multiplexed signals received at each of the second input/output port 47b and the third input/output-port 47c of the first power splitter 47 are split into first and second portions. Each of the first portions from the second and third input/output ports 47b and 47c of the first power splitter 47 is directed as a feedback signal to the first input/output port 47a. Each of the second portions from the second and third input/output ports 47b and 47c of the first power splitter 47 is directed to the fourth input/output port 47d.

The combined second portions of the signals is directed to the fourth input/output port 47d of the first power splitter are transmitted to a first input/output port 48a of the second power splitter 48. The received signal at the first input/output port 48a is split into first and second portions in the second power splitter 48 and directed to the second and third input/output ports 48b and 48c, respectively, for transmission to the respective first and second input/output ports 49d and 49e of the second Mux/Demux arrangement 49.

In the Mux/Demux arrangement 49, the signal received at the first input/output port 49d is demultiplexed in the first Mux/Demux 49a and then multiplexed in second Mux/Demux 49b while being filtered with the spectral response for an exemplary jth wavelength of $f_2{}^j(w)$ in the Mux/Demux arrangement 49, and appears as an output signal at the second input/output port 49e thereof. The signal received at the second input/output port 49e is demultiplexed in the second Mux/Demux 49b and then multiplexed in first Mux/Demux 49a while being filtered with the spectral response $f_2{}^j(w)$ for the exemplary jth wavelength of the Mux/Demux arrangement 49, and appears as an output signal at the first input/output port 49d thereof. Each of the output signals from the first and second input/output ports 49d and 49e, respectively, are transmitted to the respective second and third input/output ports 48b and 48c of the second power splitter 48 where they are combined and fed back to the fourth input/output port 47d of the first power splitter 47. The combined signal received at the fourth input/output port 47d of the first power splitter 47 is split into first and second portions. These first and second portions are directed to the second and third input/output ports 47b and 47c, respectively, to add a component to (a) the respective output signal being sent via path D to the output of the stabilized multiple laser system 40, and (b) to the feedback signal being sent via path G to the third input/output port 46c of the first Mux/Demux 46.

The resultant feedback signals from the first power splitter 47 received at the second and third input/output ports 46b and 46c, respectively, of the first Mux/Demux 46 are demultiplexed and filtered with the spectral responses $f_1^j(w)$ and $f_3^j(w)$, respectively. The demultiplexed and filtered signals are directed to corresponding ones of the plurality of n first input/output ports 46a. The center wavelength of the spectral response $f_3^j(w)$ between the plurality of n first input/output ports 46a and the third input/output port 46c is shifted towards a shorter wavelength relative to a center wavelength of the spectral response $f_1^j(w)$ between the plurality of n first input/output ports 46a and the second input/output port 46b. Each of the plurality of n demultiplexed signals from the first Mux/Demux 46 appearing at corresponding ones of the plurality of first input/output ports 46a is transmitted through the corresponding ones of the plurality of n optional polarization rotators 42a–42n and to the front facet 41p of the associated one of the plurality of n laser sources 41a–41n.

The feedback signal comprises four main components. A first main component is obtained by a signal propagating the optical paths of A→B→C→B→A where it is filtered by the spectral responses $f_1^j(w)$ and $f_3^j(w)$ in sequence. A second main component is obtained by a signal propagating the optical paths of A→B→G→C→B→A where it is filtered by the spectral responses $f_3^j(w)$ and $f_1^j(w)$ in sequence. A third main component is obtained by a signal propagating the optical paths of A→B→G→H→J→K→H→G→B→A. A portion of the reflected feedback signal received by the first power splitter 47 via path H adds a component to the output signal transmitted from the input/output ports 47b thereof. A fourth main component is obtained by a signal propagating the optical paths A→B→C→D→E→D→C→B→A. There is a cavity formed between the reflector 45 and the combination of the second power splitter 48 and the Mux/Demux arrangement 49 including the optical paths of E→D→H→J→K→H→D→E. A signal round trip in this cavity adds two components to the feedback signal to the plurality of n laser sources 41a–41n, (one component from the reflector 45, and a second component fed back via path G). Still further, one component is also added to the output signal transmitted via path D.

It is to be appreciated and understood that the specific embodiments of the present invention that have been described are merely illustrative of the general principles of the present invention. Various modifications may be made by those skilled in the art that are consistent with the principles of the present invention.

What is claimed is:

1. A stabilized laser system comprising:
    a plurality of n lasers, each of which, while emitting light and having a preselected portion thereof fed back thereto, causes the fed back portion to be amplified and shifted in wavelength in a first direction which is spaced apart from a center wavelength of the feedback signal;
    a feedback stabilization arrangement coupled to the plurality of n lasers for generating a feedback signal having a wavelength spectrum peaking at a wavelength shifted in an opposite direction to the first direction generated by plurality of n lasers in response to the feedback signal so as to provide an output signal at the output of the stabilized laser system having a wavelength spectrum that peaks essentially at a desired wavelength; and
    a reflector located at a predetermined signal roundtrip time delay distance from the feedback stabilization arrangement for receiving the output signal therefrom, for passing a first portion thereof therethrough, and for reflecting a remaining second portion thereof back to the feedback stabilization arrangement as a secondary feedback signal that contributes to each of the plurality of n laser sources being set in a stable coherence collapse mode.

2. The apparatus of claim 1 further comprising a delay line located external to the feedback stabilization arrangement and before the reflector for providing a predetermined delay to a signal passing therethrough in either direction such that the secondary feedback signal received at each of the plurality of n laser sources sets the laser source in the stabile coherence collapse mode.

3. The apparatus of claim 1 wherein the feedback stabilization arrangement comprises:
    a multiplexer/demultiplexer comprising first and second input/outputs;
    a broadband power splitter comprising first, second, and third ports, for receiving the output signal from the second input/output port of the multiplexer/demultiplexer at said first port thereof and for splitting said received output signal into first and second portions for delivery to the second and third ports thereof, respectively, the second port providing the output signal from the feedback stabilization arrangement to the external reflector; and
    the multiplexer/demultiplexer further comprises a third input/output port coupled to the third port of the broadband power splitter, the multiplexer/demultiplexer being designed to demultiplex and filter a multiplexed signal received at the third input/output port with a second spectral response that is different from the first spectral response for providing a feedback signal to corresponding ones of the plurality of n first input/output ports thereof that is shifted in a second direction, and for multiplexing signals received from the plurality of n laser sources at the plurality of first input/output ports with the second spectral response for delivery to the third input/output port thereof.

4. The apparatus of claim 3 wherein:
    the broadband power splitter further comprises a fourth port where signals received at the second and third port thereof are each split into first and second portions, each first portion being delivered to the first port thereof and each second portion being delivered to the fourth port thereof, and signals received at the first and fourth ports thereof are each split into first and second portions, each first portion being delivered to the second port thereof and each second portion being delivered to the third port thereof; and the feedback stabilization arrangement further comprises:
a second power splitter comprising first, second, and third ports, the first port being coupled to the fourth port of the broadband power splitter such that a signal received at the first port thereof is split into first and second portions that are delivered to the second and third ports thereof, respectively, and signals received at the second and third ports are combined and delivered to the first port thereof; and
a multiplexer/demultiplexer arrangement comprising: a first and second input/output ports coupled to the second and third ports, respectively, of the second power splitter; and
a pair of multiplexer/demultiplexers that are coupled between the first and second input/output ports for demultiplexing and filtering a received multiplexed signal at each of the first and second ports thereof with a third spectral response that is different than the first and second spectral responses, and then multiplexing and filtering the demultiplexed signals for transmission from the other one of the first and second ports thereof back to the second power splitter.

5. Apparatus comprising:
a feedback stabilization arrangement comprising a multiplexer/demultiplexer comprising a plurality of n first input/output ports and a second input/output port, each first input/output port being adapted for receiving an output wavelength signal from a corresponding one of a plurality of n laser sources for filtering and multiplexing the received laser source signals using a first spectral response for generating a filtered and multiplexed output signal for transmission from the feedback stabilization arrangement at the second input/output port thereof, and for generating a filtered and demultiplexed feedback signal by the multiplexer/demultiplexer that is wavelength shifted by a predetermined amount and direction for transmission back to an output port of each of the corresponding ones of the plurality of n laser sources for stabilizing each of said plurality of laser sources at a desired output center wavelength; and
a reflector located at a predetermined signal roundtrip time delay distance from the feedback stabilization arrangement for receiving the filtered and multiplexed output signal from the feedback stabilization arrangement, for passing a first portion thereof therethrough, and for reflecting a remaining second portion back to the feedback stabilization arrangement as a secondary feedback signal that contributes to each of the plurality of n laser sources being set in a stabile coherence collapse mode.

6. The apparatus of claim 5 further comprising a delay line located external to the feedback stabilization arrangement and before the reflector for providing a predetermined delay to a signal passing therethrough in either direction such that the secondary feedback signal received at each of the plurality of n laser sources sets the laser source in the stabile coherence collapse mode.

7. The apparatus of claim 5 wherein the feedback stabilization arrangement further comprises:
a broadband power splitter comprising a first, second, and third port for receiving the multiplexed output signal from the second input/output of the multiplexer/demultiplexer at said first port and splitting said received multiplexed output signal into first and second portions for delivery to the second and third ports thereof, respectively, the second port providing the output signal from the feedback stabilization arrangement to the external reflector; and
the multiplexer/demultiplexer further comprises a third input/output port coupled to the third port of the broadband power splitter, the multiplexer/demultiplexer being designed to demultiplex and filter a multiplexed signal received at the third input/output port with a second spectral response that is different from the first spectral response for providing a feedback signal to corresponding ones of the plurality of n first input/output ports thereof that is shifted by the predetermined amount and direction, and for multiplexing signals received from the plurality of n laser sources at the plurality of first input/output ports with the second spectral response for delivery to the third input/output port thereof.

8. The apparatus of claim 7 wherein:
the broadband power splitter further comprises a fourth port where signals received at the second and third port thereof are each split into first and second portions, each first portion being delivered to the first port thereof and each second portion being delivered to the fourth port thereof, and signals received at the first and fourth ports thereof are each split into first and second portions, each first portion being delivered to the second port thereof and each second portion being delivered to the third port thereof; and
the feedback stabilization arrangement further comprises:
a second power splitter comprising first, second, and third ports, the first port being coupled to the fourth port of the broadband power splitter such that a signal received at the first port thereof is split into first and second portions that are delivered to the second and third ports thereof, respectively, and signals received at the second and third ports are combined and delivered to the first port thereof; and
a multiplexer/demultiplexer arrangement comprising: a first and second input/output ports coupled to the second and third ports, respectively, of the second power splitter; and
a pair of multiplexer/demultiplexers that are coupled between the first and second input/output ports for demultiplexing and filtering a received multiplexed signal at each of the first and second ports thereof with a third spectral response that is different than the first and second spectral responses, and then multiplexing the filtered and demultiplexed signals for transmission from the other one of the first and second ports thereof back to the second power splitter.

9. A feedback stabilization system comprising:
a plurality of n laser sources, each laser source, which, while emitting light and having a preselected portion thereof fed back thereto, causes the fed back portion to be amplified and shifted in wavelength in a first direction which is spaced apart from the center wavelength of the feedback signal;
a feedback stabilization arrangement comprising a multiplexer/demultiplexer comprising a plurality of n first input/output ports, each first input/output port being coupled for receiving an output signal from a corresponding one of the plurality of n laser sources for filtering the received signals using a first spectral response and multiplexing the received signals for generating a filtered and multiplexed output signal at a second input/output port thereof for use as an output signal from the feedback stabilization arrangement, and for generating a filtered and demultiplexed feedback signal by the multiplexer/demultiplexer that is wavelength shifted by a predetermined amount and direction for transmission back to an output port of each of the corresponding ones of the plurality of n laser sources for stabilizing each of said plurality of laser sources at the desired output center wavelength; and a reflector located at a predetermined signal round-trip time delay distance from the feedback stabilization arrangement for receiving the multiplexed output signal from the feedback stabilization arrangement, for passing a first portion thereof therethrough, and for reflecting a remaining second portion back to the feedback stabilization arrangement as a secondary feedback signal that contributes to each of the plurality of n laser sources being set in a stabile coherence collapse mode.

10. The apparatus of claim 9 further comprising a delay line located between the feedback stabilization arrangement and the reflector for providing a predetermined delay to a signal passing therethrough in either direction such that the secondary feedback signal received at each of the plurality of n laser sources sets the laser source in the stabilized coherence collapse mode.

11. The apparatus of claim 9 wherein the feedback stabilization arrangement further comprises:

a broadband power splitter comprising a first, second, and third port for receiving the multiplexed output signal from a second input/output port of the multiplexer/demultiplexer at the first port thereof and splitting said received signal into first and second portions for delivery to the second and third ports thereof, respectively, the second port providing the output signal from the feedback stabilization arrangement to the external reflector; and the multiplexer/demultiplexer further comprises a third input/output port coupled to the third port of the broadband power splitter, the multiplexer/demultiplexer being designed to demultiplex and filter a multiplexed signal received at the third input/output port with a second spectral response that is different from the first spectral response for providing a feedback signal to corresponding ones of the plurality of n first input/output ports thereof that is shifted in a second direction, and for multiplexing signals received from the plurality of n laser sources at the plurality of first input/output ports with the second spectral response for delivery to the third input/output port thereof.

12. The apparatus of claim 11 wherein:

the broadband power splitter further comprises a fourth port where signals received at the second and third port thereof are each split into first and second portions, each first portion being delivered to the first port and each second portion being delivered to the fourth port, and signals received at the first and fourth ports thereof are each split into first and second portions, each first portion being delivered to the second port and each second portion being delivered to the third port; and the feedback stabilization arrangement further comprises:

a second power splitter comprising first, second, and third ports, the first port being coupled to the fourth port of the broadband power splitter such that a signal received at the first port thereof is split into first and second portions that are delivered to the second and third ports thereof, respectively, and signals received at the second and third ports are combined and delivered to the first port thereof; and a multiplexer/demultiplexer arrangement comprising: a first and second input/output ports coupled to the second and third ports, respectively, of the second power splitter; and a pair of multiplexer/demultiplexers that are coupled between the first and second input/output ports for demultiplexing and filtering a received multiplexed signal at each of the first and second ports thereof with a third spectral response that is different than the first and second spectral responses, and then multiplexing the filtered and demultiplexed signals for transmission from the other one of the first and second ports thereof back to the second power splitter.

13. A method of stabilizing a laser system to generate an output signal having a desired wavelength comprising the steps of:

(a) generating light signals from each of a plurality of n laser sources, which, while emitting light and having a preselected portion thereof fed back thereto, the output signal of each of the plurality of n laser sources is shifted in wavelength in a first direction which is spaced apart from a center wavelength of the feedback signal;

(b) generating a feedback signal in a feedback stabilization arrangement that is coupled to the plurality of n laser sources having a wavelength spectrum peaking at a wavelength shifted in an opposite direction to the first direction generated by the plurality of n lasers in response to the feedback signal so as to provide an output signal at the output of the stabilized laser system having a wavelength spectrum that peaks essentially at the desired wavelength; and (c) reflecting a portion of the output signal from the stabilized laser system from step (b) back into the laser system as a secondary feedback signal that is delay by a predetermined amount for contributing to each of the plurality of n laser sources being set in a stable coherence collapse mode.

14. The method of claim 13 wherein in step (b) performing the substeps of:

(b1) multiplexing and filtering the output channel signals from the plurality of n laser sources with a predetermined first spectral response for generating a multiplexed output signal;

(b2) dividing the multiplexed output signal from step (b1) into first and second portions thereof, said first portion being coupled to provide an output signal from the laser system;

(b3) processing the second portion of the multiplexed output signal from step (b2) such that the wavelength thereof is shifted in an opposite direction to the first direction;

(b4) demultiplexing and feeding back the processed second portion of the signal from step (b2) to the input/output of corresponding ones of the plurality of n laser sources such that the output signal of the laser system is stabilized at essentially the desired wavelength.

15. The method of claim 14 wherein in step (b3) performing the substep of:

(b3a) processing the second portion of the multiplexed output signal from step (b2) with a predetermined second spectral response which is different than the first spectral response to generate a feedback signal to each of the plurality of n laser sources that is shifted in an opposite direction to the first direction.

16. The method of claim 14 wherein:
in step (b2) performing the substep of:
(b2a) receiving the multiplexed output from step (b1) at the first port of a broadband power splitter thereof and splitting said received signal into first and second portions for delivery to second and third ports thereof, respectively, the second port providing the output signal from the laser system; and in step (b3) performing the substep of:
(b3a) processing the second portion of the multiplexed output signal from step (b2) with a predetermined second spectral response which is different than the first spectral response to generate a feedback signal to each of the plurality of n laser sources that is shifted in an opposite direction to the first direction.

* * * * *